(12) United States Patent
Kazmirski et al.

(10) Patent No.: US 11,307,239 B2
(45) Date of Patent: Apr. 19, 2022

(54) POWER TRANSISTOR JUNCTION TEMPERATURE DETERMINATION USING A DESATURATION VOLTAGE SENSING CIRCUIT

(71) Applicant: NIO USA, Inc., San Jose, CA (US)

(72) Inventors: Todd J. Kazmirski, San Jose, CA (US); Miaosen Shen, Fremont, CA (US)

(73) Assignee: NIO USA, Inc., San Jose, CA (US)

(*) Notice: Subject to any disclaimer, the term of this patent is extended or adjusted under 35 U.S.C. 154(b) by 119 days.

(21) Appl. No.: 16/557,746

(22) Filed: Aug. 30, 2019

(65) Prior Publication Data

US 2021/0063467 A1   Mar. 4, 2021

(51) Int. Cl.

| | |
|---|---|
| *G01R 31/26* | (2020.01) |
| *G01R 31/00* | (2006.01) |
| *H03M 1/12* | (2006.01) |
| *H03K 17/0814* | (2006.01) |
| *B60L 53/20* | (2019.01) |
| *B60L 3/00* | (2019.01) |

(52) U.S. Cl.
CPC ........ *G01R 31/2621* (2013.01); *B60L 3/0084* (2013.01); *B60L 53/20* (2019.02); *G01R 31/007* (2013.01); *G01R 31/2632* (2013.01); *H03K 17/08142* (2013.01); *H03M 1/1295* (2013.01)

(58) Field of Classification Search
CPC .............. G01R 31/2621; G01R 31/007; G01R 31/2632; H03M 1/1295; H03K 17/08142; B60L 53/20; B60L 3/0084
See application file for complete search history.

(56) References Cited

U.S. PATENT DOCUMENTS

| | | |
|---|---|---|
| 6,870,357 B1 | 3/2005 | Falik |
| 7,333,904 B2 * | 2/2008 | Turner ..................... G01K 7/01 374/E7.028 |
| 2015/0365003 A1 | 12/2015 | Sadwick |
| 2016/0377488 A1 | 12/2016 | Sjoroos et al. |
| 2018/0097515 A1 | 4/2018 | Norling et al. |
| 2019/0204889 A1 * | 7/2019 | Kaeriyama .............. G01K 7/01 |

FOREIGN PATENT DOCUMENTS

CN        110376500 A   * 10/2019

* cited by examiner

*Primary Examiner* — Daniel R Miller
(74) *Attorney, Agent, or Firm* — Sheridan Ross P.C.

(57) ABSTRACT

A measurement circuit device for a vehicle includes a power transistor and a voltage measurement circuit coupled to the power transistor that measures a voltage across the power transistor. The measurement circuit device also includes a microcontroller that determines a junction temperature using the measured voltage and adjusts a capacity of the power transistor based on the determined junction temperature. In some embodiments, the measurement circuit device may include a clamping device that clamps the voltage across the transistor when the transistor is off. The measurement circuit device may also include an analog-to-digital converter that converts the measured voltage from an analog value to a digital value.

18 Claims, 11 Drawing Sheets

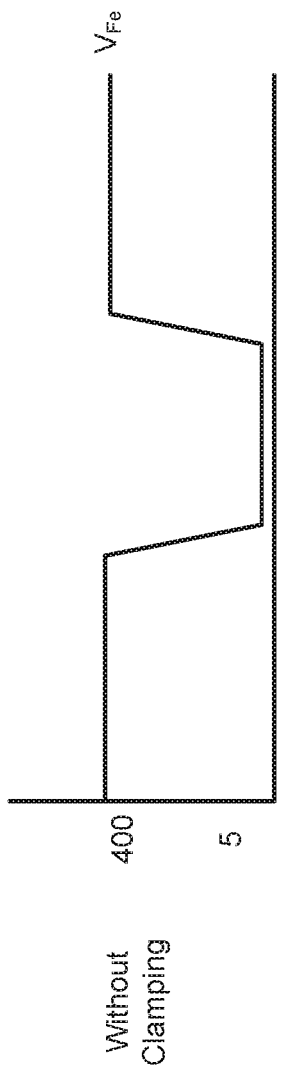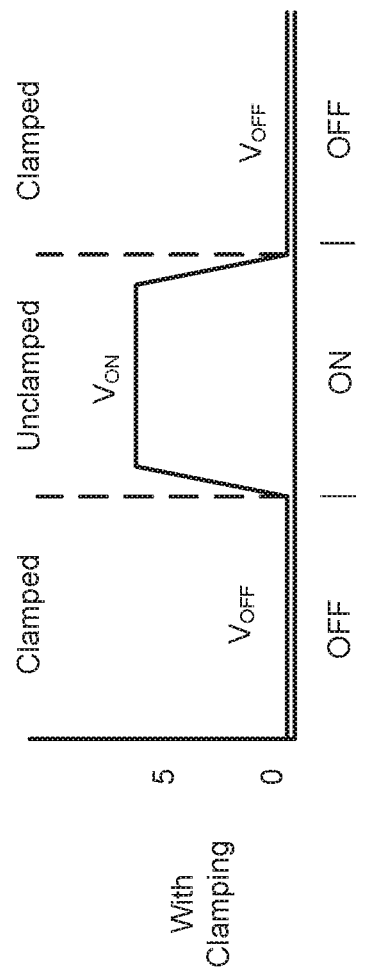

POWER TRANSISTOR JUNCTION TEMPERATURE DETERMINATION USING A DESATURATION VOLTAGE SENSING CIRCUIT

FIELD

The present disclosure is generally directed to power transistor junction temperature determination, and more particularly to power transistors in vehicle power systems.

BACKGROUND

In recent years, transportation methods have changed substantially. This change is due, in part, to a concern over the limited availability of natural resources, a proliferation in personal technology, and a societal shift to adopt more environmentally friendly transportation solutions. These considerations have encouraged the development of a number of new flexible-fuel vehicles, hybrid-electric vehicles, and electric vehicles (EVs). Most vehicles, particularly electric and hybrid vehicles, include power systems that monitor and control the operation of the batteries and other systems within the vehicle itself. For example, a power system of an electric vehicle controls the vehicle's powertrain as well as inverters or loads, such as heating and cooling components, dashboard electronics, etc. As the industry continues to develop, additional/alternative power systems are desired. Electric vehicles are dependent on the integrity and reliability of the on-board electrical energy power supply and energy storage devices.

The power supply systems in these electric vehicles use transistors. Transistors are semiconductor devices used to amplify or switch electronic signals. Power transistors are intended to switch electronic signals with higher levels of power (>=~10 watts). There are many types of power transistors, such as a bi-polar junction transistor (BJT), a metal oxide semiconductor field-effect transistor (MOSFET), an insulated-gate bipolar transistor (IGBT), and a silicon carbide field effect transistor (SiCFET).

Controlling the electrical current in a power transistor to a safe and optimum level is critical to full utilization of the transistor. The optimum current level is a function of transistor-junction temperature and is generally higher at low temperatures and lower at higher temperatures. Thus, the optimum current level can be determined by knowing the power transistor junction temperature. Determining the power transistor junction temperature is a critical control input to inverters, battery chargers, and DC-DC converters to optimize reliability, performance, and cost.

Transistor junction temperature, or junction temperature, represents the highest operating temperature of the actual semiconductor. Power transistors may be mounted on a heatsink in order to conduct energy (i.e., heat) away from the transistor to reduce temperature rise. A method that is typically used to estimate the power transistor junction temperature is to measure the temperature of the heatsink. This method utilizes a temperature sensing device like a positive temperature coefficient resistor (PTC) or resistance temperature detector (RTD) located on the heatsink. A circuit injects current into the PTC and/or RTD devices and then measures the voltage. This voltage can be translated into a temperature for the heatsink. However, the temperature of the heatsink is not the temperature of the transistor, and therefore not as accurate.

The transistor junction temperature can be estimated from the heatsink temperature by also knowing the power transistor loss and the thermal resistance from the transistor junction to the heatsink. However, power loss is difficult to measure in a circuit. In addition, thermal resistance has manufacturing variation and is not typically measurable in a circuit. Therefore, this approach assumes the worst-case thermal resistance and peak power loss, and then calculates the junction temperature based on these two assumptions and the heatsink temperature. This provides a worst case estimate of the junction temperature at peak power and results in the transistor being operated below its full capability or capacity. Furthermore, extra equipment is required to determine the temperature of the heatsink, which increases cost and may require additional space to house the additional equipment.

In other previous methods, a temperature sensor is mounted on the power transistor case, in order to measure the temperature of the transistor. However, in operation, the temperature of the transistor junction will be higher than the transistor case where the sensor is mounted. Additionally, similar to the methods discussed above, this method requires additional equipment, which increases cost, and may require additional room to accommodate the sensor.

BRIEF DESCRIPTION OF THE DRAWINGS

FIGS. 10A and 10B are waveform diagrams illustrating the voltage across the transistor during OFF/ON states with and without clamping in accordance with the present disclosure.

DETAILED DESCRIPTION

In some embodiments, the present disclosure describes a measurement circuit device that includes a measurement circuit to determine the junction temperature of a power transistor. The capacity of the transistor may be adjusted based on the determined junction temperature in order to maintain optimum current levels and fully utilize the capacity of the power transistor. The capacity may be controlled using a microcontroller. In some examples, the measurement circuit may comprise a protection circuit such as a desaturation (desat) voltage sensing circuit. In other examples, another circuit in the power system may be used to perform the method of the embodiments of the present disclosure. Additionally, the measurement circuit device may include a clamp in order to clamp the voltage in the measurement circuit when the transistor is off. The measurement circuit device may further include an analog-to-digital (A/D) converter for converting the voltage from an analog value to a digital value.

In some embodiments, the present disclosure describes a method for using a measurement circuit device to determine the junction temperature of a power transistor. The current capacity of the transistor may be adjusted based on the determined junction temperature in order to maintain optimum current levels and fully utilize the capacity of the power transistor. The method may further include clamping the voltage in the measurement circuit when the transistor is in the off state. The method may also include converting the determined voltage from an analog value to a digital value. In some examples, the measurement circuit may comprise a protection circuit such as a desaturation (desat) voltage sensing circuit. In other examples, another circuit in the power system may be used to perform the method of the embodiments of the present disclosure. The various operations, such as monitoring, measuring, clamping, converting, etc. may be performed by one device or multiple different devices.

The voltage across a transistor (drain to source) as a generic function may be expressed as follows:

$$V_{ds}=f(I_d, V_g, T_j)$$

where $I_d$=transistor current; $V_g$=gate voltage; and $T_j$=junction temperature.
This voltage is referred to as the on voltage or saturation voltage. If the on voltage is measured, and the current and gate voltage are known, then the junction temperature can be computed.

Embodiments of the present disclosure will be described in connection with a vehicle, and more particularly with respect to an automobile. However, for the avoidance of doubt, the present disclosure encompasses the use of the aspects described herein in power systems other than power systems in vehicles.

Figure 1:
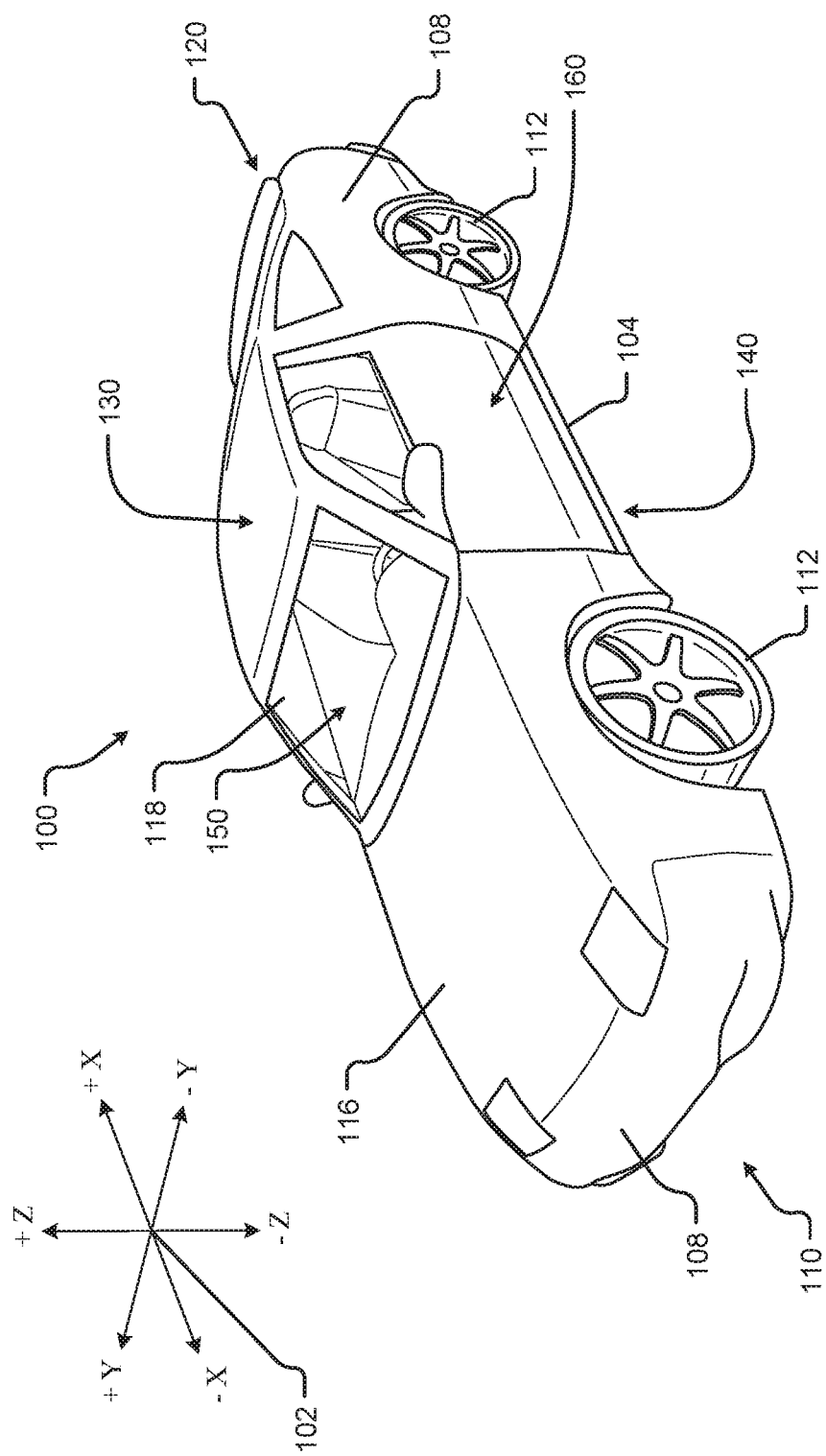
FIG. 1 shows a perspective view of a vehicle (or electric vehicle) in accordance with at least one example embodiment.

FIG. 1 shows a perspective view of a vehicle (or electric vehicle) 100 in accordance with example embodiments. The vehicle 100 comprises a vehicle front 110, vehicle aft 120, vehicle roof 130, at least one vehicle side 160, a vehicle undercarriage 140, and a vehicle interior 150. The vehicle 100 may include a frame 104, one or more body panels 108 mounted or affixed thereto, and a windshield 118. The vehicle 100 may include one or more interior components (e.g., components inside an interior space 150, or user space, of a vehicle 100, etc.), exterior components (e.g., components outside of the interior space 150, or user space, of a vehicle 100, etc.), drive systems, controls systems, structural components, etc.

Coordinate system 102 is provided for added clarity in referencing relative locations in the vehicle 100. In this detailed description, an object is forward of another object or component if the object is located in the −X direction relative to the other object or component. Conversely, an object is rearward of another object or component if the object is located in the +X direction relative to the other object or component.

The vehicle 100 may be, by way of example only, a battery electric vehicle (BEV) or a hybrid electric vehicle (HEV). Where the vehicle 100 is BEV, the vehicle 100 may comprise one or more electric motors powered by electricity from an on-board battery pack. The electric motors may, for example, be mounted near or adjacent to an axis or axle of each wheel 112 of the vehicle. The battery pack may be mounted on the vehicle undercarriage 140. In such embodiments, the front compartment of the vehicle, referring to the space located under the vehicle hood 116, may be a storage or trunk space. Where the vehicle 100 is an HEV, the vehicle 100 may comprise the above described elements of a BEV with the addition of a gas-powered (or diesel-powered) engine and associated components in the front compartment (under the vehicle hood 116), which engine may be configured to drive either or both of the front wheels 112 and the rear wheels 112. In some embodiments where the vehicle 100 is an HEV, the gas-powered engine and associated components may be located in a rear compartment of the vehicle 100, leaving the front compartment available for storage or trunk space or for other uses. In some embodiments, the vehicle 100 may be, in addition to a BEV and an HEV, a fuel cell vehicle.

Although shown in the form of a car, it should be appreciated that the vehicle 100 described herein may include any conveyance or model of a conveyance, where the conveyance was designed for the purpose of moving one or more tangible objects, such as people, animals, cargo, and the like. Typical vehicles may include, but are in no way limited to, cars, trucks, motorcycles, buses, automobiles, trains, railed conveyances, boats, ships, marine conveyances, submarine conveyances, airplanes, space craft, flying machines, human-powered conveyances, drones, and/or the like.

The vehicle 100 may be capable of autonomous operation, wherein one or more processors receive information from various sensors around the vehicle and use that information to control the speed and direction of the vehicle 100 so as to avoid hitting obstacles and to navigate safely from an origin to a destination. In such embodiments, a steering wheel is unnecessary, as the one or more processors, rather than a vehicle occupant, control the steering of the vehicle 100.

Figure 2:
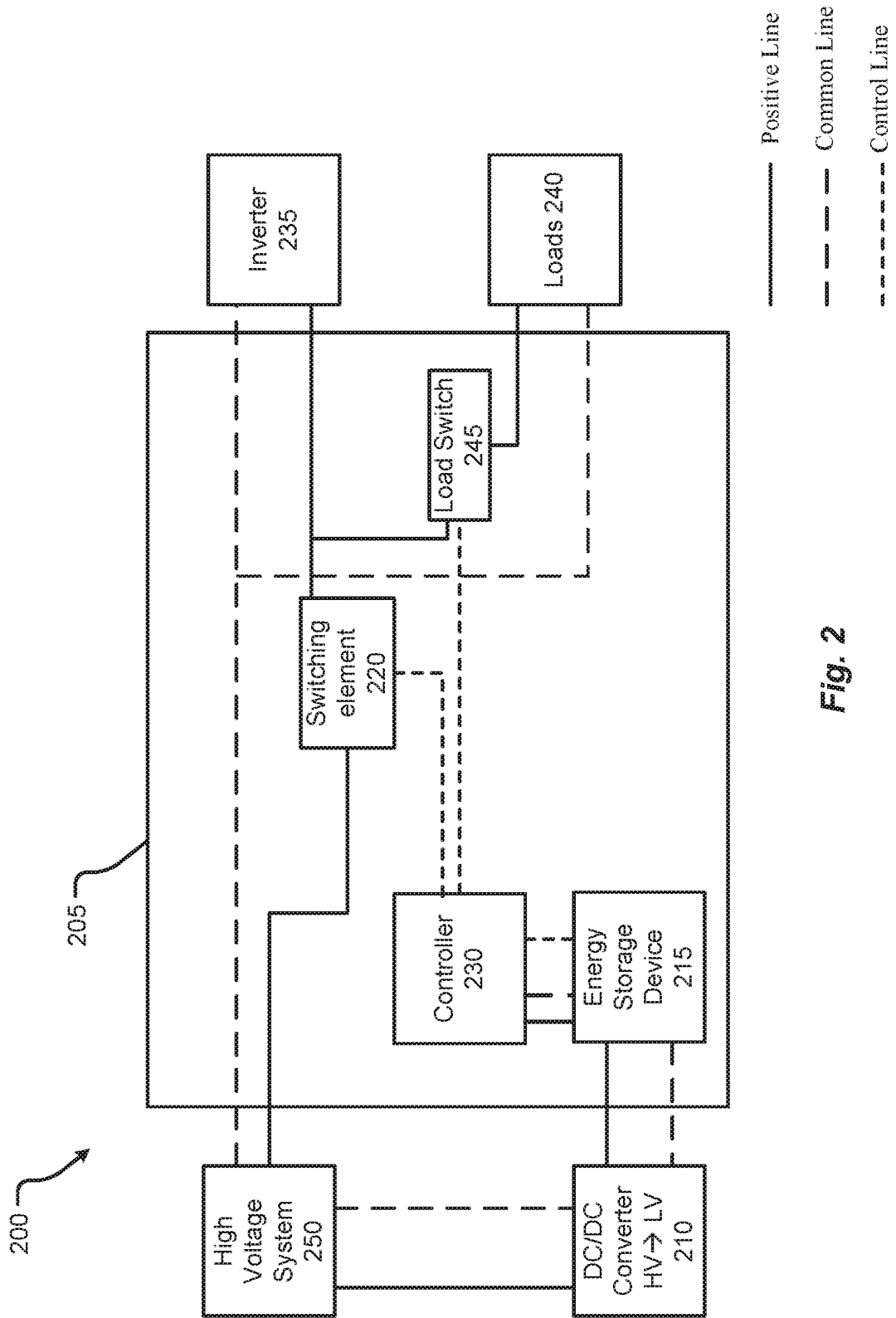
FIG. 2 is an example block diagram of a high voltage power system of the vehicle in accordance with at least one example embodiment.

FIG. 2 is a block diagram of a power system 200 for the electric vehicle 100 in accordance with at least one example embodiment. Typical applications of the present disclosure are applications in high voltage power systems 250. In some embodiments, the present disclosure may be applicable to low voltage power system.

Figure 4:
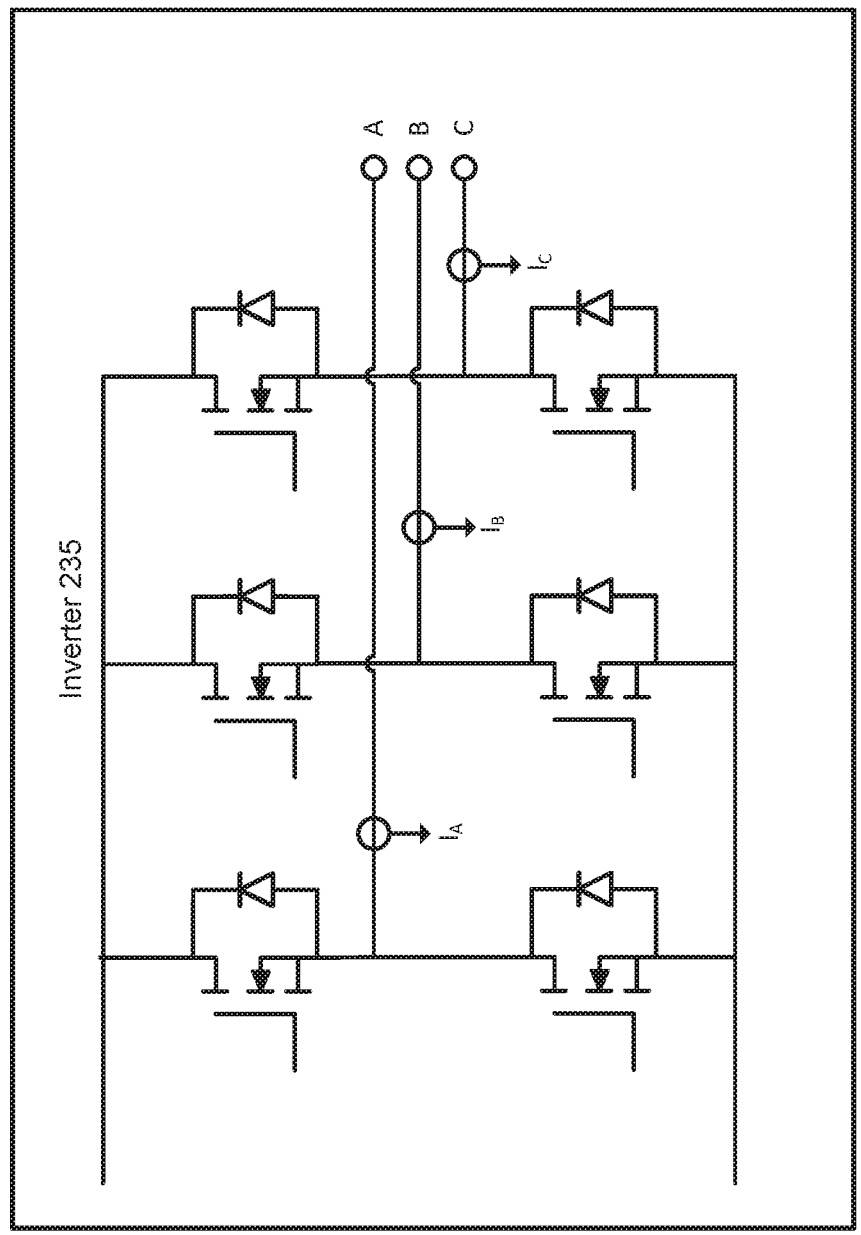
FIG. 4 is a schematic diagram illustrating a 3-phase inverter in accordance with the present disclosure.

The power system 200 includes a power supply device 205, a DC/DC converter 210 (e.g., for converting a high voltage to a lower voltage for use in a low voltage system), a high voltage system (or external power source) 250, inverter 235, and load(s) 240. In some examples, inverter 235 controls the powertrain and/or wheel system of vehicle 100. In some embodiments, the measurement circuit disclosed herein may be included in the inverter 235, as illustrated in FIG. 4.

The power supply device 205 includes an energy storage device (or battery) 215, a switching element 220, and a load switch 245. In some embodiments, the measurement circuit and other systems in accordance with the present disclosure may be included in inverter 235. The power supply device 205 may be an uninterruptable power supply (UPS) device for providing an uninterrupted supply of power to the inverter 235 and/or load 240, for example. The transistors may be included in various components of the high voltage system, such as, but not limited to, inverter 235, an on-board battery charger (not shown), and the DC/DC converter 210.

The high voltage system 250 may power the vehicle 100 when the vehicle is in operation. For example, if the vehicle 100 is an electric vehicle, then the high voltage system 250 may include one or more rechargeable battery packs (e.g., 400V, 800V, etc.) that power a drivetrain of the vehicle 100 to cause movement of the vehicle 100. During normal vehicle operation, the power provided by the high voltage system 250 to the converter 210 is converted to a voltage (e.g., 12V) that is stored in the energy storage device 215.

The elements in FIG. 2 may be powered and controlled as shown by the solid line, long dashed line, and short dashed line. In FIG. 2, the solid line is a positive power supply line connected to positive terminals of each element, the long-dashed line is a common/ground supply line connected to common/ground terminals of each element, and the short-dashed line connected to control ports of each element.

Figure 3:
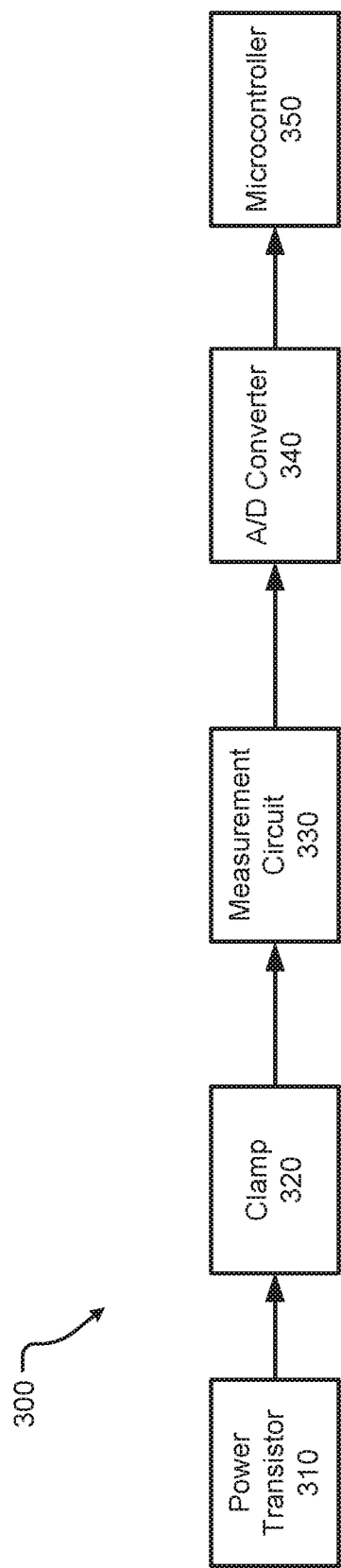
FIG. 3 is a block diagram illustrating an example system for determining the junction temperature of a power transistor in accordance with the present disclosure.

FIG. 3 is a measurement circuit device 300 in accordance with at least one example embodiment of the present disclosure. In some embodiments, measurement circuit device 300 may be used in vehicle 100 and/or power system 200. Measurement circuit device 300 includes power transistor 310, clamp 320, a measurement circuit 330, an analog-to-digital (A/D) converter 340, and a microcontroller 350.

The power transistor 310 is coupled to the clamp 320. The clamp 320 may clamp the voltage across the measurement circuit 330 when the power transistor 310 is turned off. For example, with reference to FIGS. 8 and 10A/B, when the transistor 310 is off the voltage across transistor 310=100v, while $V_{Fe}$=0. When the power transistor 310 is on the voltage across transistor 310=5v. Therefore, clamping allows for faster response time when transitioning between on/off states, since the capacitor ($C_1$) does not need to be significantly discharged before the on voltage can be measured. Although example embodiments have been discussed with reference to specific voltage/current values, it should be understood that example embodiments are not limited thereto. For instance, example embodiments may also be applied to vehicle systems that charge/operate at different voltages/currents than those specifically referenced herein.

In some embodiments, the measurement circuit 330 comprises a protection desaturation circuit that is already present in the gate drive circuit used to control the transistor.

The A/D converter 340 converts the measured voltage from an analog value to a digital value for processing by the microcontroller 350. The microcontroller 350 uses the digital value received from the A/D converter 340 to determine a junction temperature for the power transistor 310.

The microcontroller 350 may also adjust the current capacity of the power transistor 310 based on the determined junction temperature. For example, if the junction temperature of the power transistor 310 increases from a previous junction temperature, microcontroller 350 may decrease the current capacity of the power transistor 310. In another example, if the junction temperature of the power transistor 310 decreases from a previous junction temperature, microcontroller 350 may increase the current capacity of the power transistor 310. Although shown as separate components in FIG. 3, it should be appreciated that some or all of the components may be included in a single device. In some embodiments, the measurement circuit device periodically measures the junction temperature, for example, once every second. In other embodiments, the measurement circuit device 300 continuously monitors the status of the power transistor 310, including the voltage, the current, and the gate voltage.

The measurement circuit device 300 must have fast response time and tolerate the high voltage encountered during the off state and switching transitions of the transistor 310. It does this by clamping the measured voltage, using the clamp 320, during the off state and switching transitions. This allows it to achieve high resolution and fast response time during the on-state measurement time.

FIG. 4 illustrates further detail of inverter 235 from FIG. 2 in accordance with at least one example embodiment. As shown in FIG. 4, the inverter 235 includes 6 transistors and 3 current sensors. In this configuration, the transistors are controlled individually and switched in a sequence to generate a three-phase voltage and current output at the terminals A, B and C. The current sensors are used as part of a closed loop control system to regulate output current. In this example embodiment, the current sensor signals can also be used to monitor transistor current and combined with transistor drain to source voltage and gate to source voltage to compute transistor junction temperature.

Figure 5B:
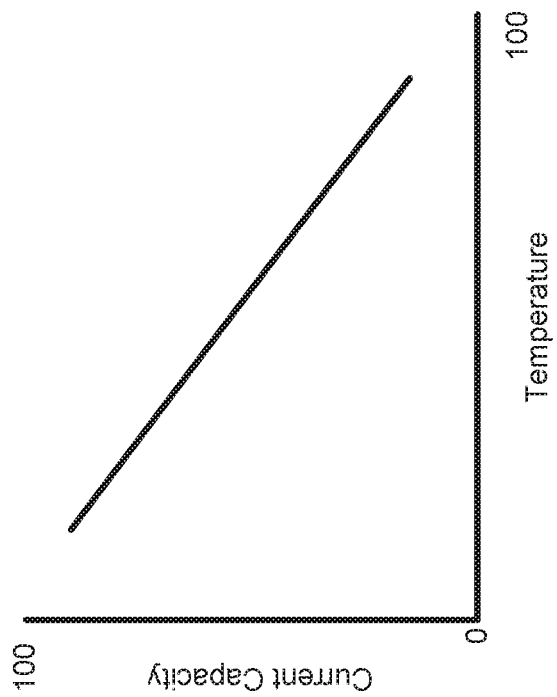
FIGS. 5A and 5B are graphs illustrating transistor capacity as a function of temperature in accordance with the present disclosure.
Figure 5A:
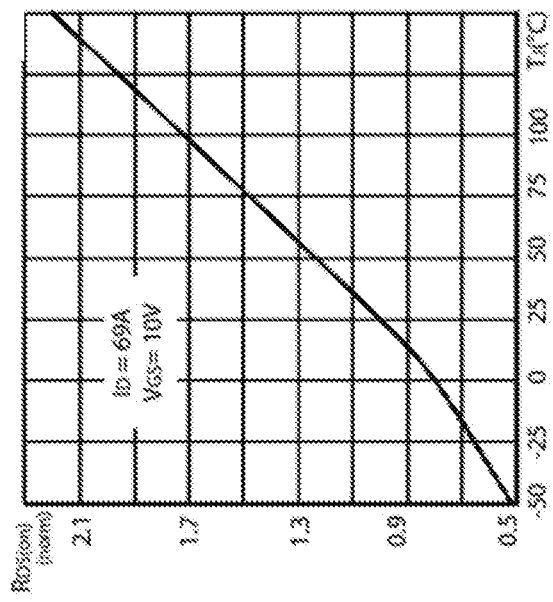

FIG. 5A is a graph that illustrates the relationship between $R_{DS(on)}$ and temperature. $R_{DS(on)}$ stands for "drain-source on resistance," or the total resistance between the drain and source in a transistor, when the transistor is "on." $R_{DS(on)}$ is measured on the y-axis, and temperature is measured on the x-axis. Generally, the lower the $R_{DS(on)}$, the better.

FIG. 5B is a graph illustrating the relationship between transistor current capacity and temperature. Current capacity is measured on the y-axis and temperature is measured on the x-axis. Generally, at higher temperatures, the current capacity of the transistor decreases. Therefore, in order to optimize the transistor's current capacity while also avoiding overloading, the current capacity of the transistor must be adjusted based on the junction temperature.

If the temperature of the transistor increases, the capacity must be lowered. Conversely, if the temperature of the transistor decreases, the capacity can be increased. If the transistor junction temperature cannot be accurately measured, the transistor may be designed to accommodate the worse-case scenario. That is to say, it is assumed that the transistor is always operating at the highest temperature and the capacity is adjusted accordingly. However, that means at lower temperatures the transistor is not being utilized at its full capacity. To accurately adjust the transistor's capacity, the junction temperature must be accurately measured. Controlling the electrical current in a power transistor (i.e., the optimum capacity) to a safe and optimum level is critical to robustness, full utilization of the transistor, and product cost.

Figure 6:
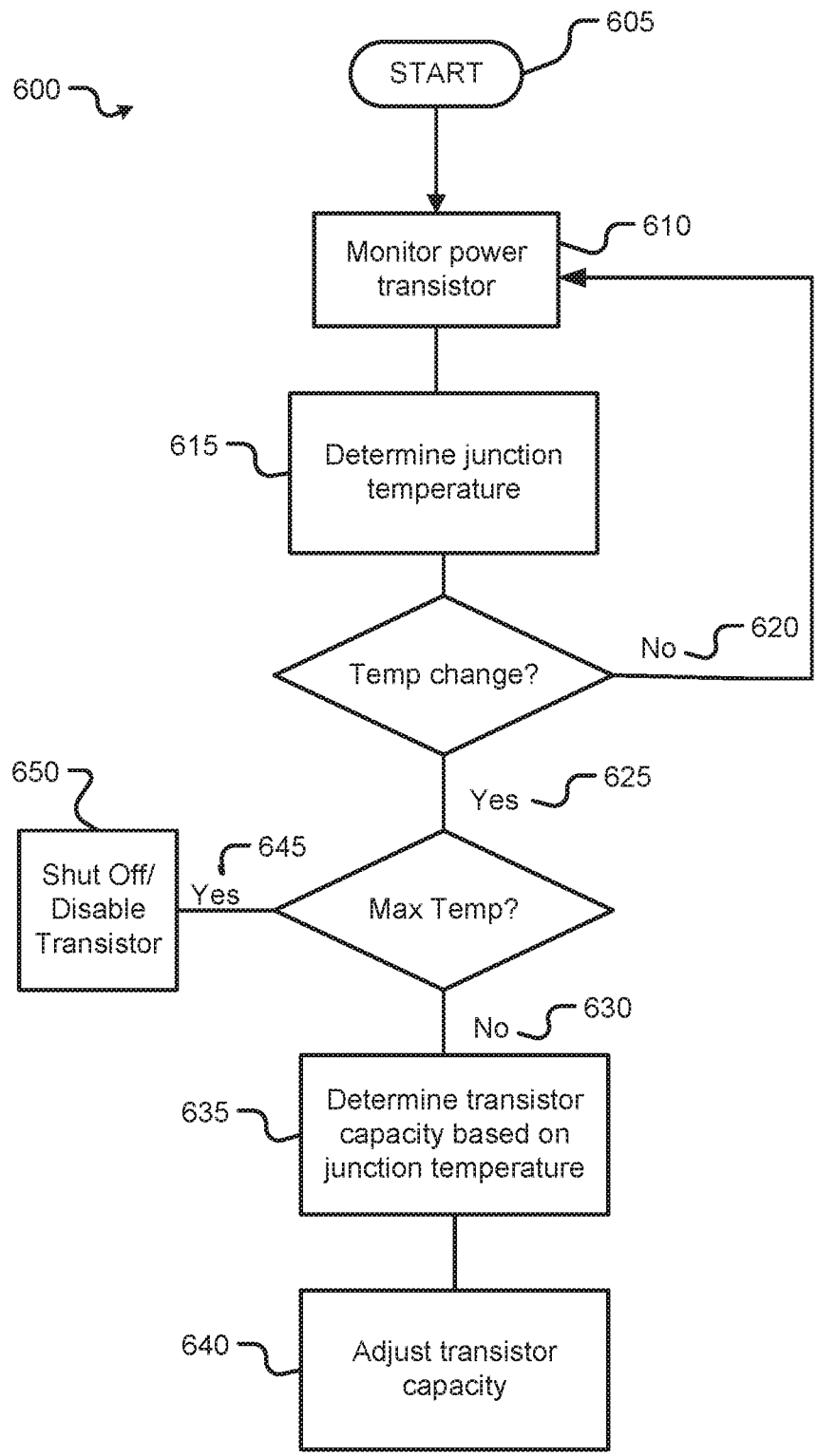
FIG. 6 is a flow diagram illustrating example operations of the system(s) depicted in FIGS. 2-4 in accordance with at least one example embodiment.

FIG. 6 is a flowchart illustrating an example process to determine the junction temperature of a transistor and adjust the capacity of the transistor based on the determined junction temperature, in accordance with embodiments of the present disclosure.

FIG. 6 illustrates a method 600 to adjust the current capacity of a power transistor in a power supply device, for example, increasing and decreasing the current capacity of the power transistor to optimum levels based on the junction temperature, according to at least one example embodiment. For example, the method 600 may be used in inverter 235 included in vehicle 100 to adjust the capacity of power transistor 310.

While a general order for the steps of the method 600 is shown in FIG. 6, the method 600 can include more or fewer steps or can arrange the order of the steps differently than those shown in FIG. 6.

The method 600 can be executed as a set of computer-executable instructions encoded or stored on a computer readable medium and executed by the microcontroller 350 in FIG. 3. Alternatively, the operations discussed with respect to FIG. 6 may be implemented by the various elements of the system(s) FIGS. 1-11. Hereinafter, the method 600 shall be explained with reference to the systems, components, assemblies, devices, user interfaces, environments, software, etc. described in conjunction with FIGS. 1-11.

Generally, the method 600 starts at operation 605. At operation 610, the measurement circuit 330 monitors the voltage, current, and gate voltage in the power transistor 310. The measurement circuit 330 sends the voltage value to an A/D converter 340, which converts the analog value to a digital value. The digital value is used by the microcontroller 350 to determine a junction temperature for the power transistor 310 (operation 615). The temperature may be determined periodically or in response to a trigger.

The determined temperature may be compared to the previously determined temperature to determine if the junction temperature has changed. If there is no change (operation 620), the measurement circuit 330 continues to monitor the status of the power transistor 310.

If the temperature has changed (operation 625), the temperature may be compared to a maximum allowed temperature or other threshold, if the determined temperature is greater than or equal to the maximum temperature (operation 645), the power transistor 310 and/or vehicle 100 may be shut off/disabled. If the determined temperature is less than the maximum temperature (operation 630), the microcontroller 350 determines the optimum capacity of the power transistor 310 based on the determined temperature (operation 365). In some embodiments, the operation 635 is performed in response to a detected change in temperature. In other embodiments, the capacity of the transistor 310 may be periodically recalculated. The microcontroller 350 adjusts the capacity of the transistor 310 to the determined capacity (operation 640). For example, if the junction temperature of the power transistor 310 increases from a previous junction temperature, microcontroller 350 may decrease the capacity of the power transistor 310. In another example, if the junction temperature of the power transistor 310 decreases from a previous junction temperature, microcontroller 350 may increase the capacity of the power transistor 310.

Figure 11:
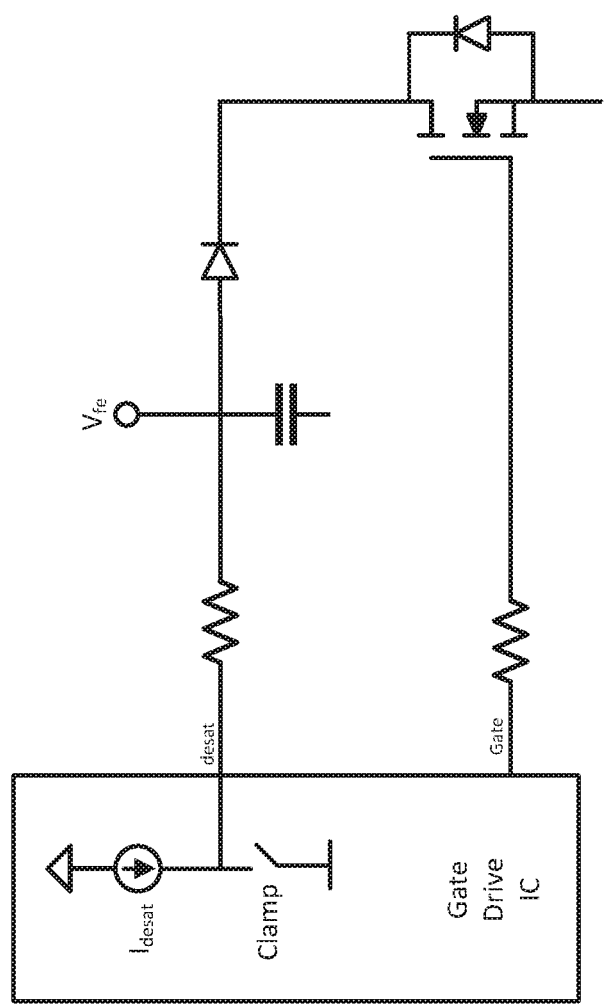
FIG. 11 is a schematic diagram of a MOSFET with a gate drive desaturation circuit in accordance with at least one example embodiment.

In some embodiments, the measurement circuit device 300 uses the analog voltage sensing section of the desat protection circuit as shown in FIG. 11, as the "front end" for a measurement circuit used to determine junction temperature. The desat protection circuit 330 measures a voltage across the power transistor 310.

Here, it should be understood that example embodiments are not limited to performing the operations of FIG. 6 while the vehicle 100 is in operation, but may alternatively or additionally be performed while the vehicle 100 is not in operation, but inverter 235 is powered up (e.g., vehicle is idle).

Figure 7:
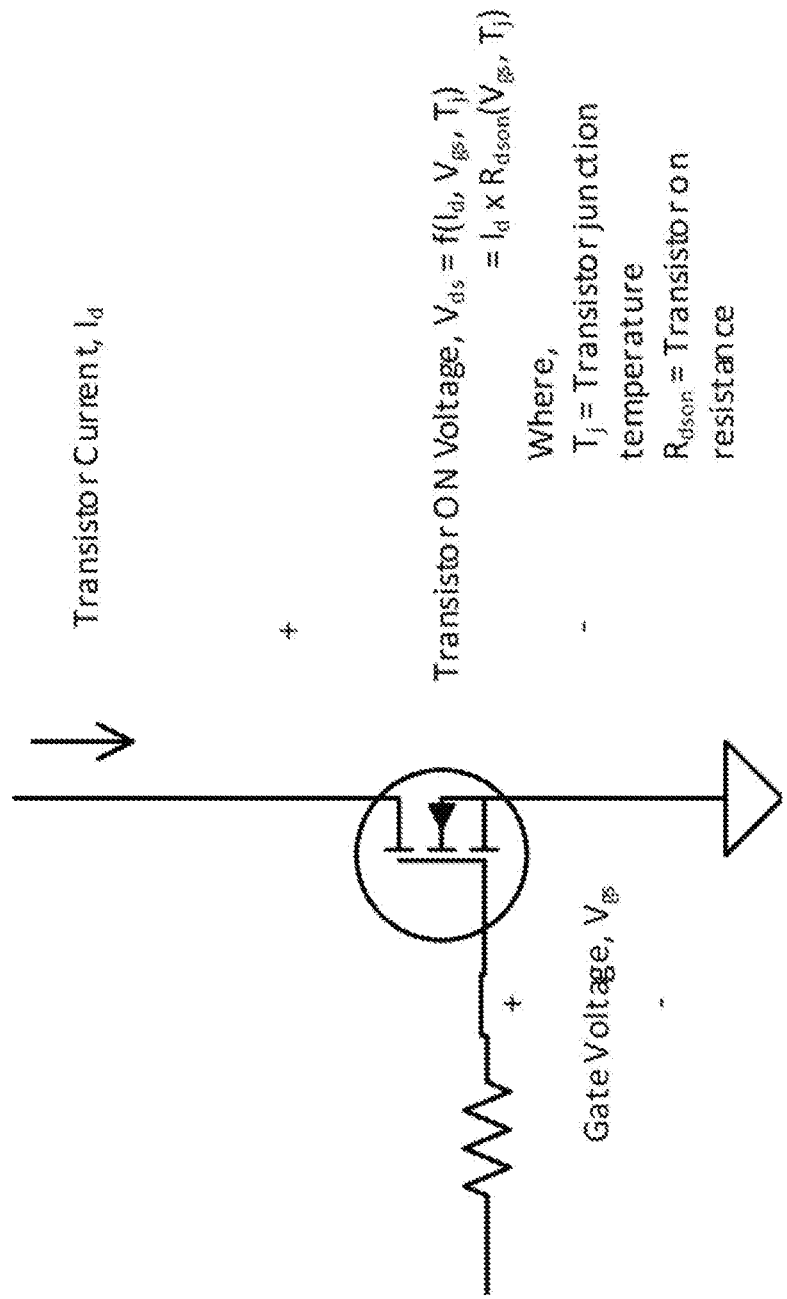
FIG. 7 is a schematic diagram of a transistor in accordance with at least one example embodiment.

FIG. 7 illustrates a high-level schematic of a MOSFET.

In a MOSFET, the voltage across the transistor (i.e., drain to source voltage ($V_{ds}$)) when the transistor is turned on (i.e., on state) is a function of current, gate voltage, and temperature. For a MOSFET, the function may be expressed as:

$$V_{ds}=I_d \times R_{dson}(V_g, T_j)$$

where $R_{dson}$=transistor on resistance

Figure 8:
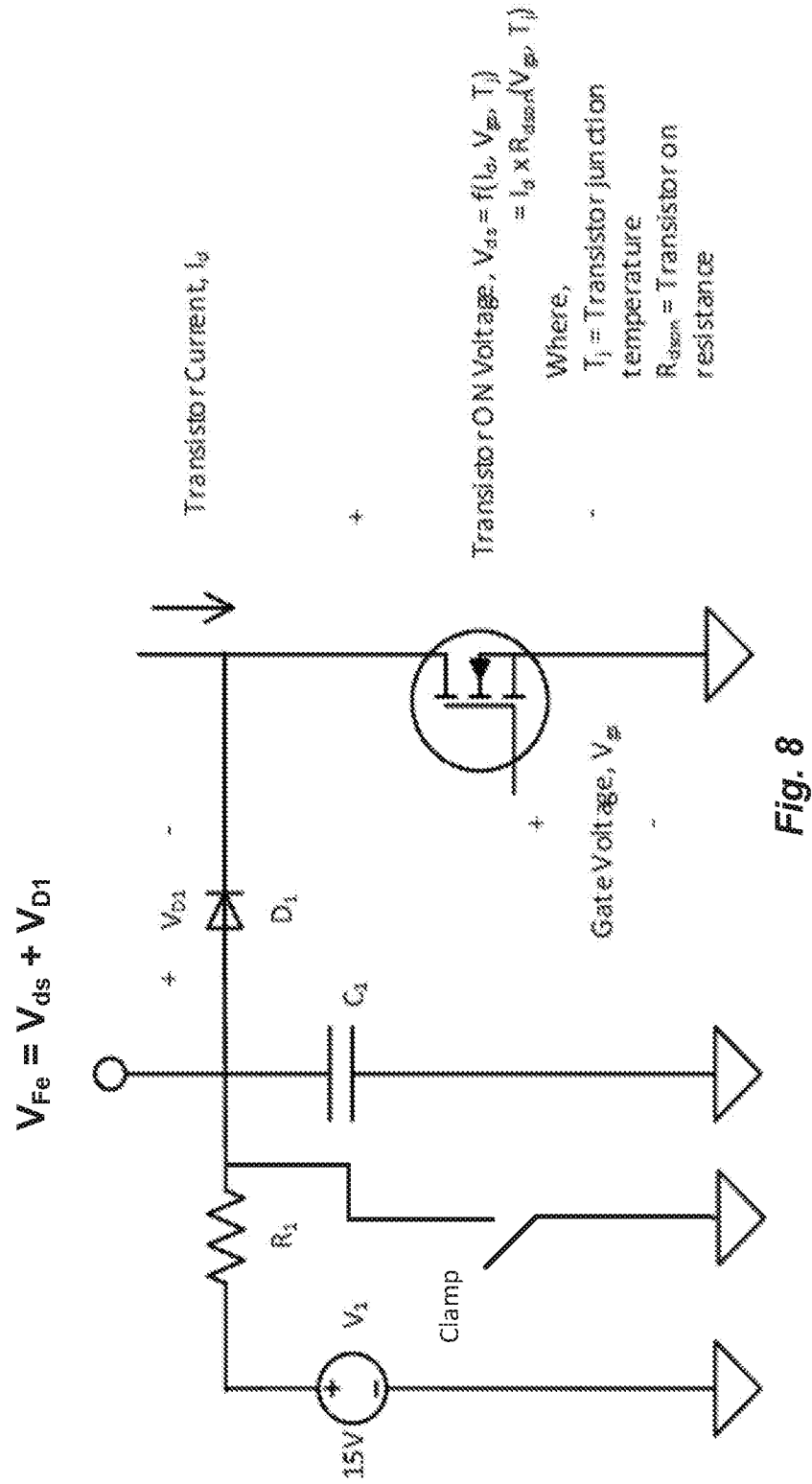
FIG. 8 is a schematic diagram of a transistor on state voltage measurement circuit including a clamp and a diode in accordance with at least one example embodiment.
Figure 9:
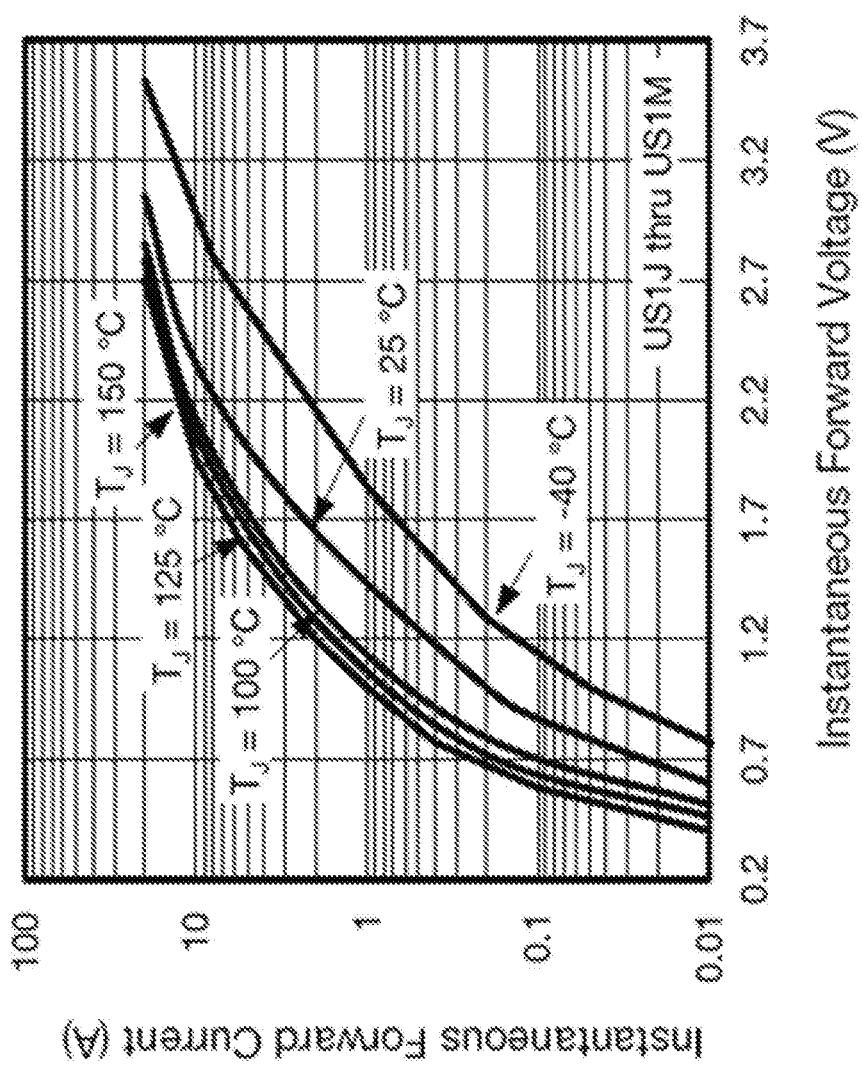
FIG. 9 is a graph showing the relationship between current, voltage, and temperature in a diode in accordance with the present disclosure.

In some embodiments, the voltage across the transistor may be measured indirectly. As illustrated in FIG. 8 the front-end voltage ($V_{Fe}$) is the sum of the voltage of drain to source ($V_{ds}$) and the voltage of diode $D_1$ ($V_{D1}$). Therefore, the drain to source voltage ($V_{ds}$) may be determined by subtracting the voltage of diode $D_1$ ($V_{D1}$) from the measured front-end voltage ($V_{Fe}$). However, the voltage of diode $D_1$ ($V_{D1}$) may also vary with the temperature as shown in FIG. 9. Therefore, $V_{D1}$ may be adjusted based on a determined temperature of the enclosure containing the diode.

In some embodiments, the voltage across the transistor may be measured indirectly. As illustrated in FIG. 8 the front-end voltage ($V_{Fe}$) is the sum of the voltage of drain to source ($V_{ds}$) and the voltage of diode $D_1$ ($V_{D1}$). If the front-end voltage ($V_{Fe}$) was used directly to determine the transistor junction temperature, the diode voltage drop would introduce an error into the calculation. This error can be eliminated by subtracting the diode voltage drop back from the front-end reading. The temperature may be further determined using the diode drop that is determined based on the diode temperature.

FIG. 9 is a graph representing the relationship between current, voltage, and temperature of typical diode in a voltage monitoring circuit 330 in FIG. 3. The diode has low heat dissipation, so the temperature of the diode may be determined by determining the temperature of the enclosure. The enclosure temperature is typically measured with a PTC on the printed circuit board. This PTC could be positioned close to the diode. Since the diode dissipates very little power, the diode's temperature will be very closely correlated to the printed circuit board and enclosure ambient temperature.

Measurement of the on voltage in a power transistor is further complicated by the wide range of voltages across the transistor. Referring to FIG. 10A, which illustrates the change in $V_{Fe}$, without clamping, as the transistor goes from an off state to an on state and back to an off state. When a transistor is off the voltage drop is high (400 volts). When the transistor is in an on state, the voltage drop is low (1-2 volts). The values for $V_{Fe}$ are for illustrative purposes only, and it should be appreciated that $V_{Fe}$ may have other values.

The voltage change that occurs during transitions from off to on and on to off should not trigger the method disclosed herein. Furthermore, reading the voltage during such transitions will provide a high voltage reading and result in a high junction temperature determination (i.e., an increase in temperature). Additionally, the off-state voltage can bias the measuring circuit to a high value. Both of these cases tend to provide a high voltage in the measurement circuit when the transistor first turns on. To eliminate this and improve the measurement response time, the measurement voltage can be held to zero or clamped when the transistor is off and during switching transitions.

FIG. 10B illustrates the use of clamping during the on/off transitions. For example, without clamping $V_{Fe}$=400 volts, with clamping $V_{off}$=zero or almost zero volts. $V_{on}$=1-2 volts, same as without clamping. Therefore, the voltage is clamped when the transistor switches to an off state. The purpose of clamping to prevent large fluctuations in voltage during switching transitions, in order to prevent the issues discussed above. Furthermore, clamping allows for quicker response time during the on-state measurement time, as the transistor changes from an off state to an on state. The values of $V_{off}$ and $V_{on}$ are for illustrative purposes only, and it should be appreciated that $V_{off}$ and $V_{on}$ may have other values.

Now referring to FIG. 11. In power transistor gate drive circuits and integrated circuits, there is often a circuit called a desat protection circuit. The purpose of this circuit is to detect excessive current or low gate drive voltage. It does this by monitoring the on-state voltage of the transistor. For example, excessive voltage across a transistor may be a result of the current being too high or the gate drive voltage being too low. Since the desat circuit measures the voltage across the transistor, and the voltage across the transistor can be used to determine junction temperature, a microcontroller may be connected to the desat circuit and used to determine junction temperature. In some embodiments, the voltage measured by the desat circuit comprises an analog value, therefore, an analog-to-digital A/D converter may be used to convert the analog value of the measured voltage to a digital value. In some embodiments, the microcontroller may use the analog value directly from the desat circuit if the controller has an internal analog to digital converter.

In some examples, the capacity of the transistor may be adjusted based on other factors, in addition to temperature. For example, operational requirements may be considered in addition to junction temperature when setting the transistor capacity.

Aspects of example embodiments include a power supply device for a vehicle, comprising: a power transistor; a voltage measurement circuit coupled to the power transistor that measures a voltage across the power transistor; and a microcontroller that determines a junction temperature using the measured voltage and adjusts a capacity of the power transistor based on the junction temperature.

Aspects of example embodiments include the power supply device, further comprising: an analog to digital converter that converts the measured voltage from an analog value to a digital value; and wherein the microcontroller determines the junction temperature using the digital value.

Aspects of example embodiments include the power supply device, further comprising: the voltage measurement circuit configured to clamp the measured voltage when the vehicle is turned off.

Aspects of example embodiments include the power supply device, wherein the voltage measurement circuit comprises a Desaturation Voltage Sensing Circuit.

Aspects of example embodiments include the power supply device, wherein the junction temperature comprises an increase in a previous junction temperature and the microcontroller is configured to decrease the capacity of the power transistor.

Aspects of example embodiments include the power supply device, wherein the junction temperature comprises a decrease in a previous junction temperature and the microcontroller is configured to increase the capacity of the power transistor.

Aspects of example embodiments include the power supply device, wherein processing the voltage drop comprises subtracting a diode voltage associated with a diode from the measured voltage.

Aspects of example embodiments include the power supply device, further comprising: adjusting the diode voltage drop before subtracting the diode voltage from the measured voltage.

Aspects of example embodiments include the power supply device, wherein adjusting the diode voltage comprises determining a temperature of the diode.

Aspects of example embodiments include the system, wherein the temperature of the diode is set to an internal ambient temperature.

Aspects of example embodiments include a method of operating a power supply device for a vehicle, the method comprising: a voltage measurement circuit coupled to a power transistor measuring a voltage across the power transistor; a microcontroller determining a junction temperature using the measured voltage; and the microcontroller adjusting a capacity of the power transistor based on the junction temperature.

Aspects of example embodiments include the method, further comprising: an analog to digital converter converting the measured voltage from an analog value to a digital value; and wherein the microcontroller determining the junction temperature using the measured value comprises the microcontroller determining the junction temperature using the digital value.

Aspects of example embodiments include the method, further comprising: the voltage measurement circuit clamping the measured voltage when the vehicle is turned off.

Aspects of example embodiments include the method, wherein the voltage measurement circuit comprises a Desaturation Voltage Sensing Circuit.

Aspects of example embodiments include the method, wherein the junction temperature comprises an increase in a previous junction temperature, and wherein the microcontroller adjusting the capacity of the power transistor based on the junction temperature comprises the microcontroller decreasing the capacity of the power transistor.

Aspects of example embodiments include the method, wherein the junction temperature comprises a decrease in a previous junction temperature, and wherein the microcontroller adjusting the capacity of the power transistor based on the junction temperature comprises the microcontroller increasing the capacity of the power transistor.

Aspects of example embodiments include measuring the voltage across the power transistor comprises subtracting a diode voltage of a diode from the measured voltage.

Aspects of example embodiments include adjusting the diode voltage before subtracting the diode voltage from the measured voltage.

Aspects of example embodiments include determining a temperature of the diode.

Aspects of example embodiments include, wherein the temperature of the diode is set to an internal ambient temperature.

Any one or more of the aspects/embodiments as substantially disclosed herein.

Any one or more of the aspects/embodiments as substantially disclosed herein optionally in combination with any one or more other aspects/embodiments as substantially disclosed herein.

One or more means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

What is claimed:

1. A measurement circuit device for a vehicle, comprising:
a power transistor;
a voltage measurement circuit coupled to the power transistor that measures a voltage across the power transistor; and
a microcontroller configured to:
subtract a diode voltage associated with a diode from the measured voltage across the power transistor to calculate an adjusted measured voltage;
monitor a transistor current and a gate voltage;
determine a junction temperature using the transistor current, the gate voltage, and the adjusted measured voltage; and
adjust a capacity of the power transistor based on the junction temperature.

2. The measurement circuit device of claim 1, further comprising:
an analog to digital converter that converts the measured voltage from an analog value to a digital value; and
wherein the microcontroller determines the junction temperature using the digital value.

3. The measurement circuit device of claim 1, further comprising:
the voltage measurement circuit configured to clamp the measured voltage when the power transistor is turned off or is switching from an off state to an on state.

4. The measurement circuit device of claim 1, wherein the voltage measurement circuit comprises a Desaturation Voltage Sensing Circuit.

5. The measurement circuit device of claim 1, wherein the junction temperature comprises an increase in a previous junction temperature and the microcontroller is configured to decrease the capacity of the power transistor.

6. The measurement circuit device of claim 1, wherein the junction temperature comprises a decrease in a previous junction temperature and the microcontroller is configured to increase the capacity of the power transistor.

7. The measurement circuit device of claim 1, wherein the microcontroller is further configured to:
adjust a diode voltage drop before subtracting the diode voltage from the measured voltage.

8. The measurement circuit device of claim 7, wherein the microcontroller is figured configured to determine a temperature of the diode.

9. The measurement circuit device of claim 8, wherein the temperature of the diode is set to an internal ambient temperature.

10. A method of operating a power supply device for a vehicle, the method comprising:
a voltage measurement circuit coupled to a power transistor measuring a voltage across the power transistor;
a microcontroller subtracting a diode voltage associated with a diode from the measured voltage across the power transistor to calculate an adjusted measured voltage;
the microcontroller monitoring a transistor current and a gate voltage, and
determining a junction temperature using the transistor current, the gate voltage, and the adjusted measured voltage; and
the microcontroller adjusting a capacity of the power transistor based on the junction temperature.

11. The method of claim 10, further comprising:
an analog to digital converter converting the measured voltage from an analog value to a digital value; and
wherein the microcontroller determining the junction temperature using the measured voltage value comprises the microcontroller determining the junction temperature using the digital value.

12. The method of claim 10, further comprising:
the voltage measurement circuit clamping the measured voltage when the power transistor is turned off or is switching from an off state to an on state.

13. The method of claim 10, wherein the voltage measurement circuit comprises a Desaturation Voltage Sensing Circuit.

14. The method of claim 10, wherein the junction temperature comprises an increase in a previous junction temperature, and wherein the microcontroller adjusting the capacity of the power transistor based on the junction temperature comprises the microcontroller decreasing the capacity of the power transistor.

15. The method of claim 10, wherein the junction temperature comprises a decrease in a previous junction temperature, and wherein the microcontroller adjusting the capacity of the power transistor based on the junction temperature comprises the microcontroller increasing the capacity of the power transistor.

16. The method of claim 10, further comprising: adjusting a diode voltage drop before subtracting the diode voltage from the measured voltage.

17. The method of claim 16 further comprising: determining a temperature of the diode.

18. The method of claim 17, wherein the temperature of the diode is set to an internal ambient temperature.

\* \* \* \* \*